(12) United States Patent
Chiang

(10) Patent No.: US 7,728,628 B2
(45) Date of Patent: Jun. 1, 2010

(54) LEVEL SHIFT CIRCUIT AND METHOD FOR THE SAME

(75) Inventor: Yun-Chi Chiang, Chupel (TW)

(73) Assignee: Richtek Technology Corporation, R.O.C., HsinChu (TW)

( * ) Notice: Subject to any disclaimer, the term of this patent is extended or adjusted under 35 U.S.C. 154(b) by 0 days.

(21) Appl. No.: 12/290,704

(22) Filed: Nov. 2, 2008

(65) Prior Publication Data

US 2009/0115456 A1 May 7, 2009

(30) Foreign Application Priority Data

Nov. 7, 2007 (TW) .............................. 96142080 A

(51) Int. Cl.
*H03K 19/094* (2006.01)
*H03K 5/00* (2006.01)
(52) U.S. Cl. ............................ 326/68; 326/81; 327/333
(58) Field of Classification Search .................. 326/63, 326/68, 80, 81, 83, 86; 327/333
See application file for complete search history.

(56) References Cited

U.S. PATENT DOCUMENTS

| | | | | |
|---|---|---|---|---|
| 4,450,371 A | * | 5/1984 | Bismarck | ...................... 326/17 |
| 7,372,314 B2 | * | 5/2008 | Hirano | ....................... 327/333 |
| 2006/0066349 A1 | * | 3/2006 | Murakami | ................... 326/81 |

* cited by examiner

*Primary Examiner*—Daniel D Chang
(74) *Attorney, Agent, or Firm*—Tung & Associates

(57) ABSTRACT

The present invention discloses a level shift circuit which comprises: a basic level shift circuit for receiving inputs of first high and low operational voltage levels and generating outputs of second low and high operational voltage levels at a first node; and an output circuit for outputting a signal of one of the second operational voltage levels according to a voltage level switching at the first node.

13 Claims, 6 Drawing Sheets

LEVEL SHIFT CIRCUIT AND METHOD FOR THE SAME

BACKGROUND OF THE INVENTION

1. Field of the Invention

The present invention relates to a level shift circuit, and in particular to a level shift circuit with faster output level switching, and a method for the same.

2. Description of the Related Art

A power control circuit chip often requires a level shift circuit to convert one DC voltage level to another. The conversion may increase the voltage difference between the high and low levels, decrease the voltage difference between the high and low levels, or shift the high and low levels to different voltages without changing the voltage difference between them. FIGS. 1-3 respectively show three examples:

The circuit of FIG. 1 converts VS1/0V (high/low level of an input signal) to VS2/0V (high/low level of an output signal), and usually VS2>VS1. VS1 and VS2 for example may be 1.5V and 3.3V, respectively. Sometimes the circuit is also used in the case where VS2<VS1. The low level of the input signal and that of the output signal are the same in this circuit.

The circuit of FIG. 2 converts VS1/0V (high/low level of an input signal) to VS1/VG2 (high/low level of an output signal), wherein 0V>VG2, VG2 being −3.3V, for example. The high level of the input signal and that of the output signal are the same in this circuit.

The circuit of FIG. 3 converts VS1/0V (high/low level of an input signal) to VS2/VG2 (high/low level of an output signal), wherein VS2>VS1, and VS2>VG2. This circuit shifts both the high and low levels, and it can increase or decrease the voltage difference between the high and low levels. VS1, VS2 and VG2 are, e.g., 1.5V, 3.3V and 1.8V, respectively. The high and low levels of the output signal are both different from that of the input signal in this circuit.

All the above-mentioned prior art circuits have a common drawback: their output level switching speed is slow. Taking the circuit of FIG. 1 for example and referring to FIGS. 4 and 5, in order to ensure that the driving strength of the NMOS transistors M3 and M4 is larger than the driving strength of the corresponding PMOS transistors M1 and M2, in particular when the NMOS transistors M3 and M4 are in their worse case and the PMOS transistors M1 and M2 in their best case, the width of the NMOS transistors M3 and M4 is typically enlarged to increase their driving strength. However, this makes the driving strength of the PMOS transistor M1 weaker than that of the NMOS transistors M3, and the driving strength of the PMOS transistor M2 weaker than that of the NMOS transistors M4, resulting in the waveforms as shown in FIG. 5, wherein the time required for the output signal of the level shift circuit to switch from low to high is much slower than the time required to switch from high to low, as referring to the time points T1, T2, T3, and T4.

In the circuit of FIG. 2, the input signal IN controls the gates of the upper transistors M1 and M2, and likely, the width of the transistors M1 and M2 will also be enlarged to increase their driving strength. As a result, in this level shift circuit, the time required for the output signal to switch from high to low is much slower than the time required to switch from low to high.

In view of the foregoing drawback, the present invention proposes a level shift circuit, which is capable of speeding up the switching time of the output signal.

SUMMARY OF THE INVENTION

A first objective of the present invention is to provide a level shift circuit with faster output level switching, in which a pulse generator generates a pulse according to the level switching at a node, and the pulse drives a latch circuit to generate the desired output.

A second objective of the present invention is to provide a level shift circuit which speeds up the output level switching by speeding up the level switching at a node.

A third objective of the present invention is to provide a method to achieve faster output level switching in a level shift circuit.

To achieve the foregoing objectives, according to an aspect of the present invention, a level shift circuit comprises: a basic level shift circuit for receiving inputs of first high and low operational voltage levels and generating outputs of second low and high operational voltage levels at a first node; and an output circuit for outputting a signal of one of the second operational voltage levels according to a voltage level switching at the first node.

Preferably, the output circuit includes a first pulse generator which generates a first pulse according to the voltage level switching at the first node; and a latch circuit which generates an output according to the generated first pulse.

According to another aspect of the present invention, a level shift circuit comprises: a basic level shift circuit for receiving inputs of first high and low operational voltage levels and generating outputs of second low and high operational voltage levels at a first node, and outputs of second high and low operational voltage levels at a second node; a first circuit device electrically connected between a voltage supply of the second high operational voltage and the second node; and a control circuit controlling the first circuit device according to a voltage level switching at the first node, such that current flows from the voltage supply of the second high operational voltage to the second node.

Preferably, the control circuit includes a first pulse generator for generating a first pulse according to the voltage level switching at the first node; the pulse controls the first circuit device such that current flows from the voltage supply of the second high operational voltage to the second node.

From yet another aspect of the present invention, a method to achieve faster output level switching in a level shift circuit comprises: providing a basic level shift circuit for receiving inputs of first high and low operational voltage levels and generating outputs of second low and high operational voltage levels at a first node; generating a pulse according to a voltage level switching at the first node; and generating a signal of one of the second operational voltage levels according to the pulse.

From a further other aspect of the present invention, a method to achieve faster output level switching in a level shift circuit comprises: providing a basic level shift circuit for receiving inputs of first high and low operational voltage levels and generating outputs of second low and high operational voltage levels at a first node, and outputs of second high and low operational voltage levels at a second node; generating a pulse according to a voltage level switching at the first node; and increasing current from a voltage supply of the second high operational voltage to the second node according to the pulse.

For better understanding the objects, characteristics, and effects of the present invention, the present invention will be described below in detail by illustrative embodiments with reference to the attached drawings.

DESCRIPTION OF THE PREFERRED EMBODIMENTS

Figure 6:
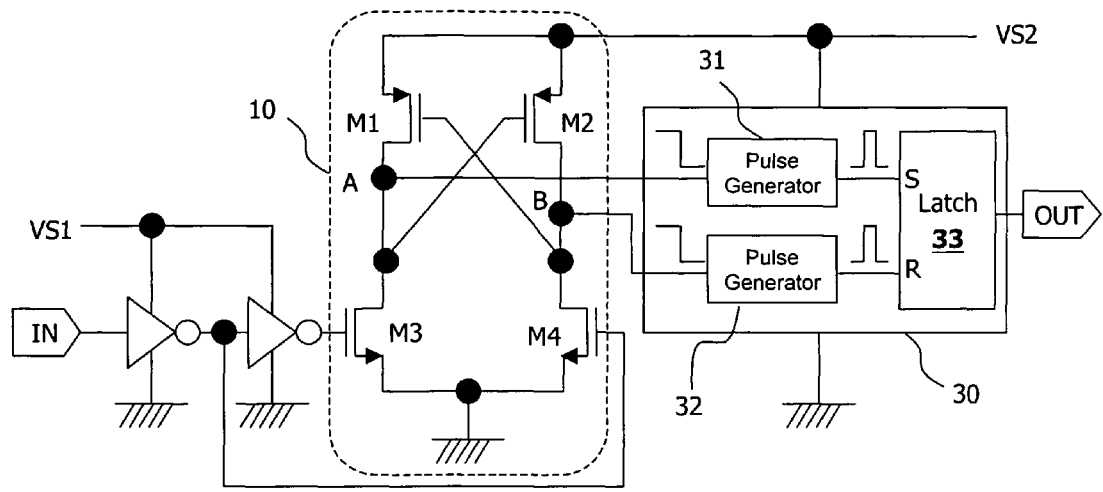
FIG. 6 is a circuit diagram schematically showing a level shift circuit according to an embodiment of the present invention.

FIG. 6 schematically shows a first embodiment according to the present invention. As shown in the figure, a level shift circuit comprises a pair of PMOS transistors M1 and M2, and a pair of NMOS transistors M3 and M4 (the PMOS and NMOS pairs constituting a basic level shift circuit 10). In addition to the above, the level shift circuit according to this embodiment further comprises an output circuit 30. The output circuit 30 includes pulse generators 31 and 32, and a latch circuit 33. The pulse generator 31 generates a pulse according to the falling edge of the signal at the node A. The pulse is received by the set input S of the latch circuit 33 so that the latch circuit 33 outputs a signal of high level. Likely, the pulse generator 32 generates a pulse according to the falling edge of the signal at the node B; the pulse is received by the reset input R of the latch circuit 33 so that the latch circuit 33 outputs a signal of low level. The output circuit 30 operates between a high level which is the second high operational voltage VS2 and a low level which is 0V, so its output signal has a high level of VS2 and a low level of 0V, which are exactly the desired signal levels to be shifted to by the level shift circuit.

Because the high level of the output signal OUT is generated according to the falling edge of the signal at the node A, not according to the rising edge of the signal at the node B, the level switching speed of the present invention is much faster then that in the prior art. According to the simulation by the inventor, the level switching time is reduced to ⅓ or lower.

Figure 7:
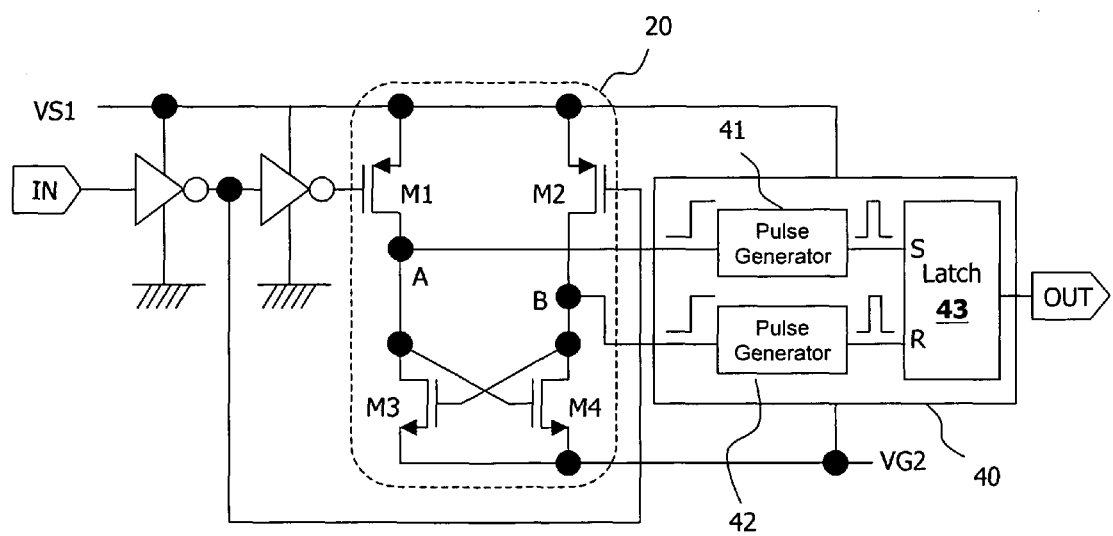
FIG. 7 is a circuit diagram schematically showing a level shift circuit according to another embodiment of the present invention.

FIG. 7 shows a second embodiment of the present invention. As shown in the figure, besides the basic level shift circuit 20, the level shift circuit further includes an output circuit 40. The output circuit 40 includes pulse generators 41 and 42, and a latch circuit 43. The pulse generator 41 generates a pulse according to the rising edge of the signal at the node A; the pulse is received by the set input S of the latch circuit 43 so that the latch circuit 43 outputs a signal of high level. Likely, the pulse generator 42 generates a pulse according to the rising edge of the signal at the node B; the pulse is received by the reset input R of the latch circuit 43 so that the latch circuit 43 outputs a signal of low level. The output circuit 40 operates between a high level which is the first high operational voltage VS1 and a low level which is VG2, so its output signal has a high level of VS1 and a low level of VG2, which are exactly the desired signal levels to be shifted to by the level shift circuit.

Similar to the previous embodiment, because the low level of the output signal OUT is generated according to the rising edge of the signal at the node B, not according to the rising edge of the signal at the node A, the level switching speed of the present invention is much faster then that in the prior art.

Figure 1:
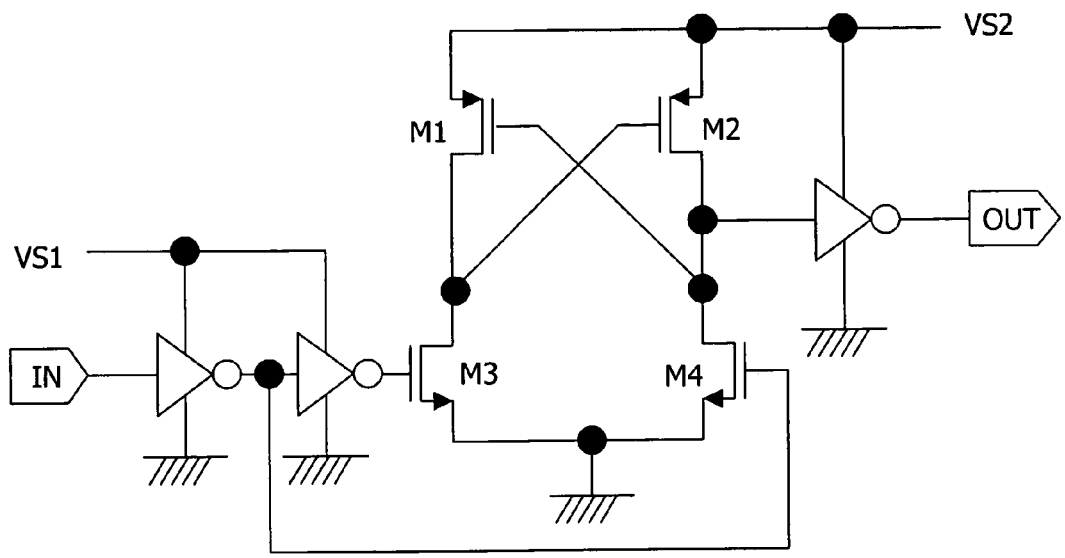
FIGS. 1-4 show conventional level shift circuits.
Figure 2:
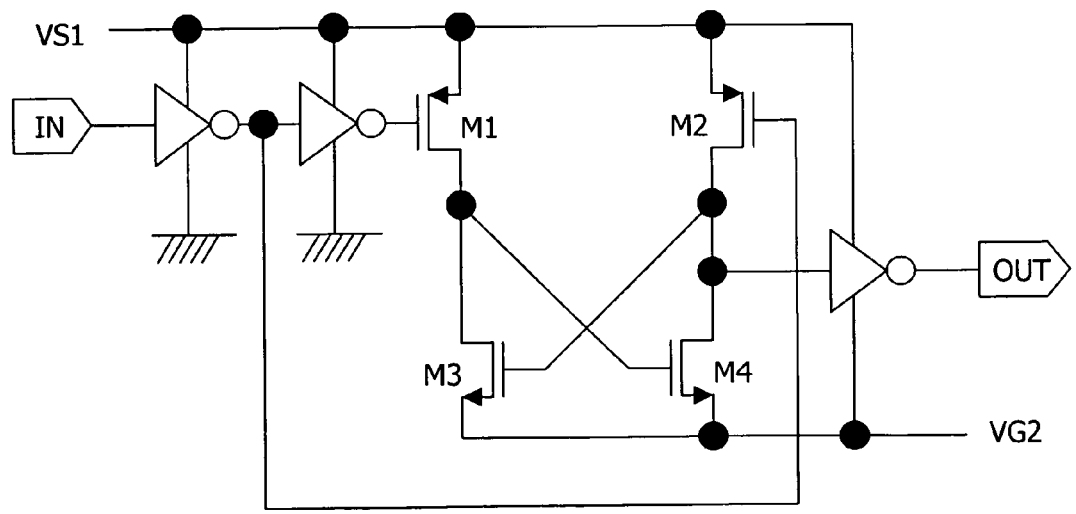
Figure 3:
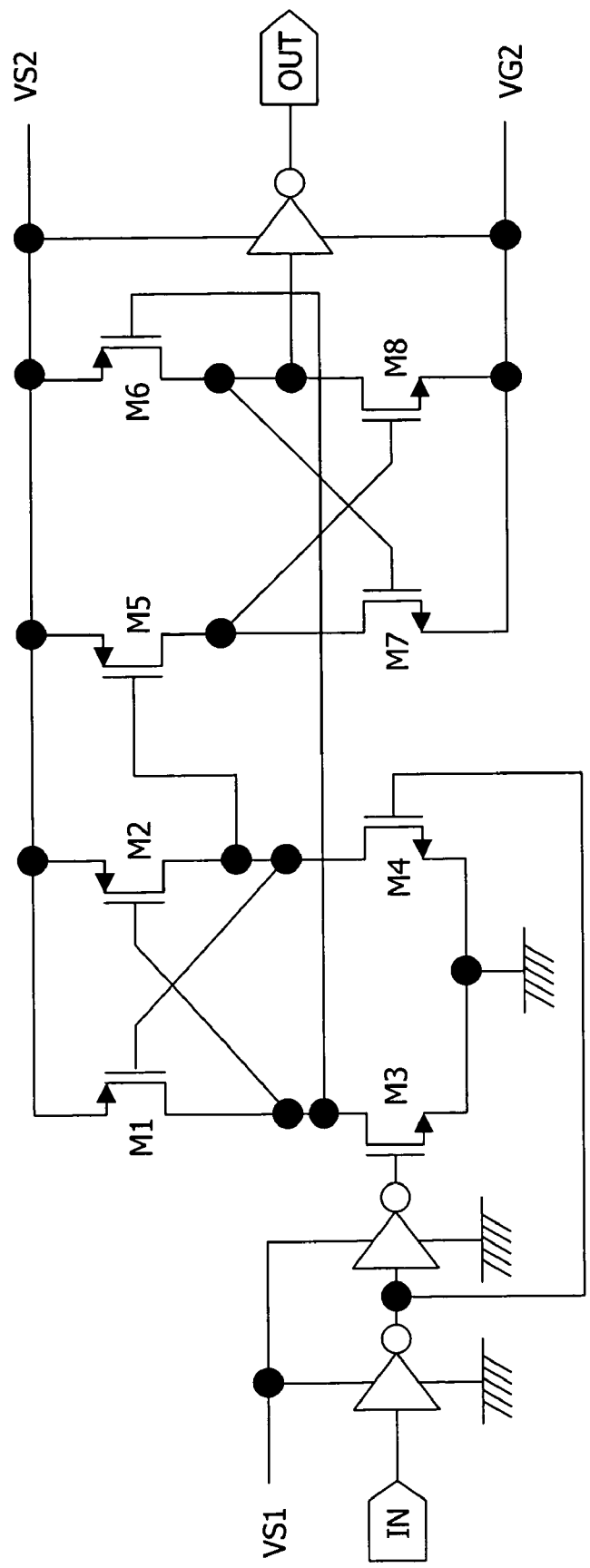
Figure 4:
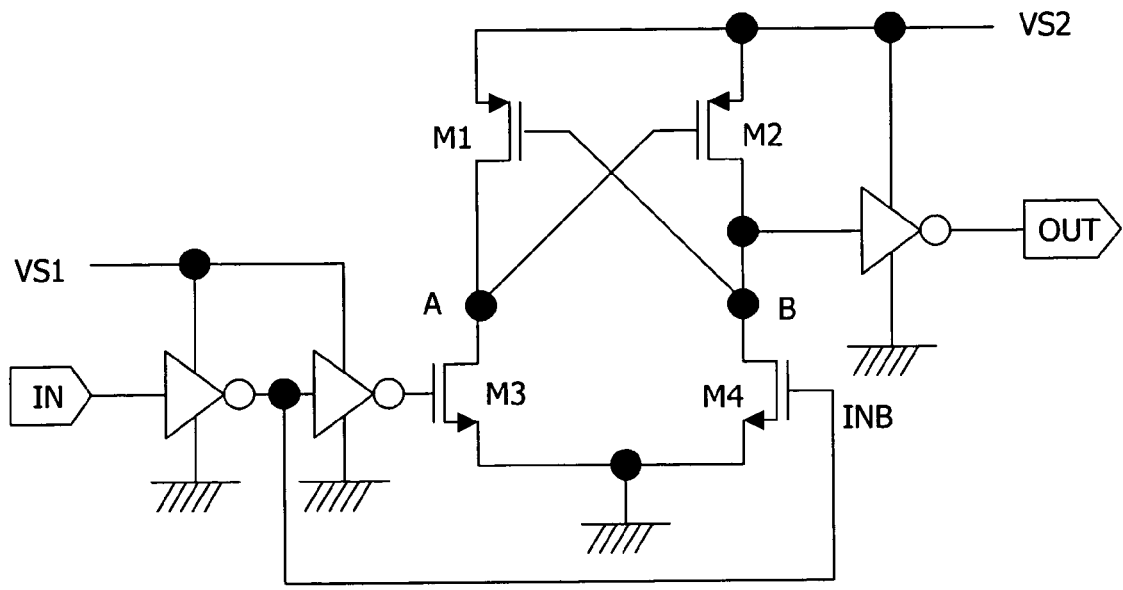
Figure 5:
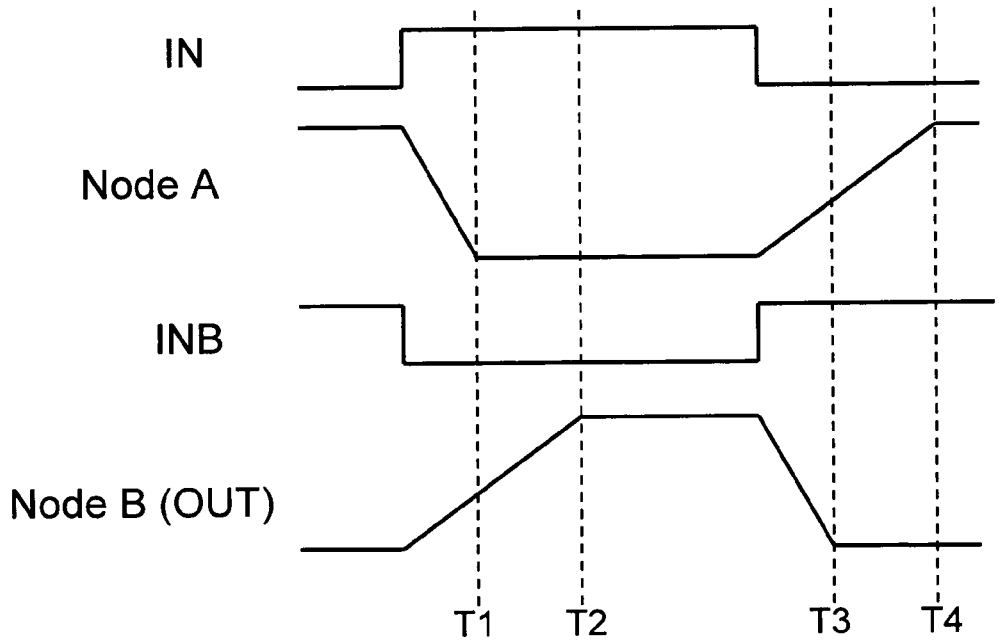
FIG. 5 shows the waveforms of the conventional level shift circuit of FIG. 1 during input and output voltage level switching.
Figure 8:
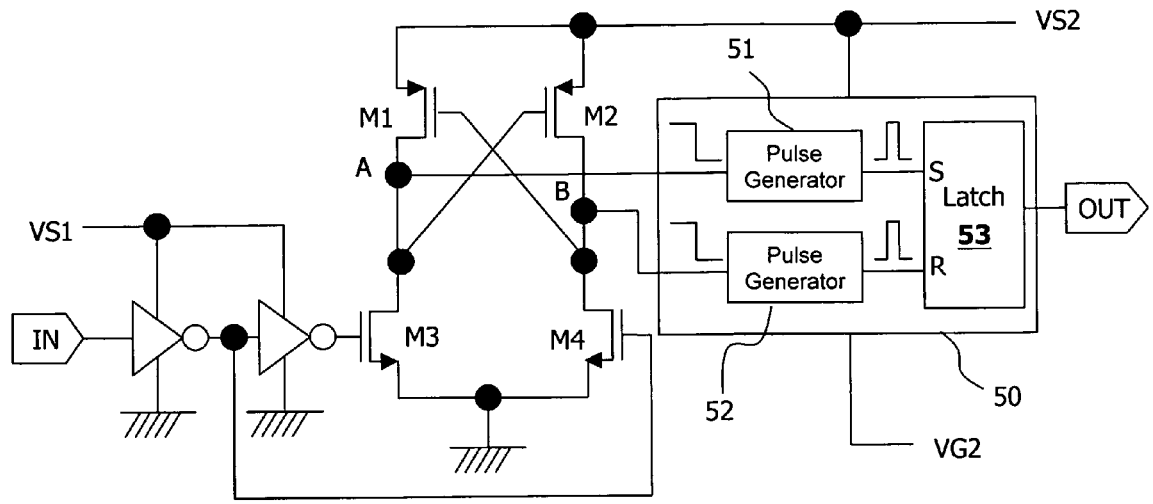
FIG. 8 shows yet another embodiment of the present invention.

FIG. 8 shows a third embodiment of the present invention. The purpose of this circuit is to shift the signal levels from VS1/0V to VS2/VG2. Note that in this embodiment, it does not require two basic level shift circuits (eight transistors) as that shown in FIG. 3, but only requires one basic level shift circuit with four transistors (either one of the basic level shift circuits 10 and 20, shown to be the basic level shift circuit 10 in the figure). The output circuit 50 operates between a high level which is VS2 and a low level which is VG2, so that its output signal has a high level of VS2 and a low level of VG2, which are exactly the desired signal levels to be shifted to by the level shift circuit.

The embodiments of FIGS. 6-8 explain the first concept of the present invention, i.e., by the level switching of the voltage signal at a critical node, which is much faster, a pulse is generated to drive a latch circuit, so that an output signal is capable of switching its levels in a much shorter time.

Figure 9:
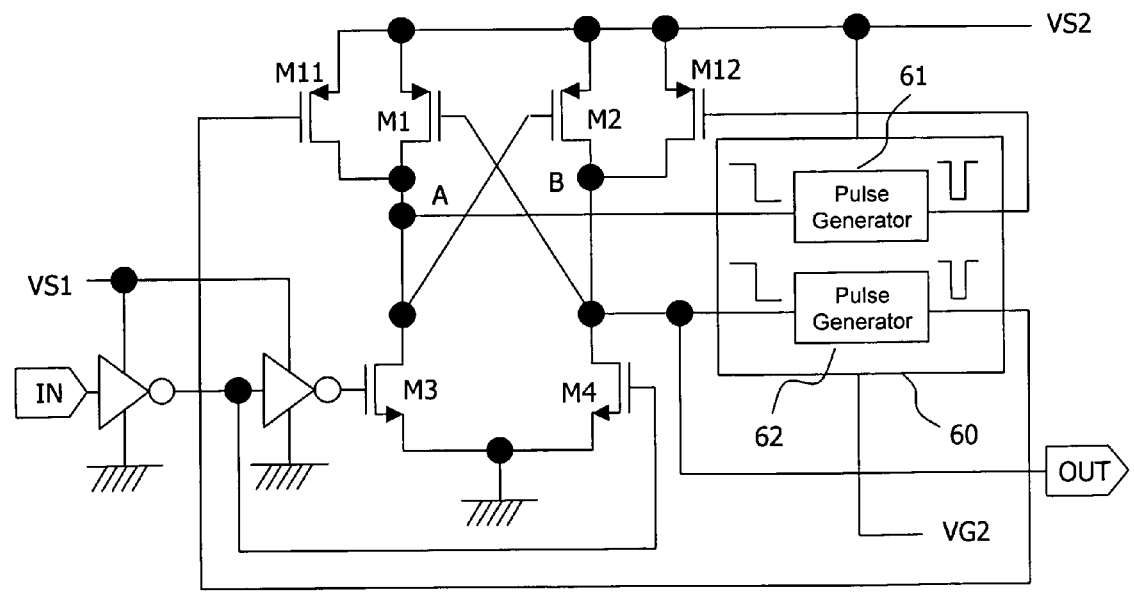
FIG. 9 shows a still other embodiment of the present invention.

FIG. 9 shows a fourth embodiment of the present invention. As shown in the figure, the level shift circuit of this embodiment further comprises two PMOS transistors M11 and M12 in addition to the basic level shift circuit 10, and the control circuit 60 includes pulse generators 61 and 62, but does not include a latch circuit. The pulse generator 61 generates a pulse according to the falling edge of the signal at the node A; the pulse is a negative pulse which controls the gate of the PMOS transistor M12 so that the PMOS transistor M12 turns ON. The width of the pulse determines the ON time of the PMOS transistor M12, which can be determined according to circuit requirement. The conduction of the transistor M12 provides a parallel path to the path through the transistor M2, so that the current from the second high operational voltage VS2 to the node B increases, speeding up the level rising of the output node OUT. Similarly, the pulse generator 62 generates a negative pulse according to the falling edge of the signal at the node B; the pulse controls the gate of the PMOS transistor M11 so that the PMOS transistor M11 turns ON, to increase the current from the second high operational voltage VS2 to the node A. In general case, the node A is required for providing an inverse output, so it is preferred that its switching speed is also increased. However, in a certain exception that the inverse output from the node A is not required in the circuit, the transistor M11 can be omitted. In this embodiment, the node B provides the output OUT, so the high and low operational levels of the control circuit 60 need not be VS1 and VG2; they are shown as an example.

Figure 10:
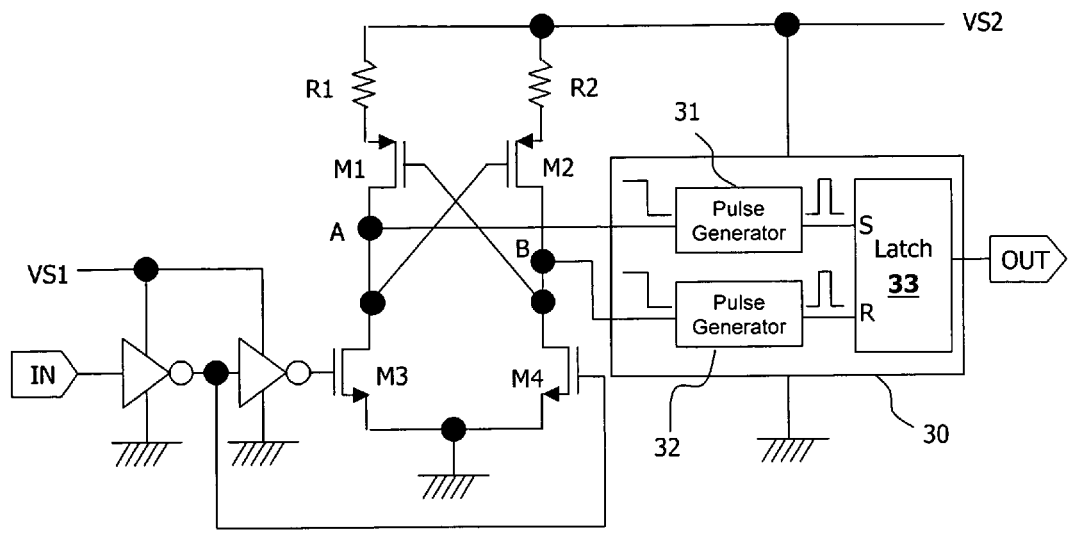
FIG. 10 shows a further other embodiment of the present invention.

FIG. 10 shows a fifth embodiment of the present invention, which is different from the first embodiment in that there are resistors R1 and R2 provided above the transistors M1 and M2. The resistors R1 and R2 provide voltage drops between the second high operational voltage VS2 and the transistors M1 and M2, respectively, so that the gate-to-source voltage difference $V_{GS}$ of the transistors M1 and M2 is decreased to reduce the conduction of the transistors M1 and M2. When the current amount increases, the voltage drops generated by the resistors R1 and R2 correspondingly increase so that the conduction of the transistors M1 and M2 is even weaker, and thus the voltage at the node A (or node B) can be pulled low by the transistors M3 (or M4) even faster.

FIG. 10 shows a sixth embodiment of the present invention, which is similar to the previous embodiment; resistors R3 and R4 are provided below the transistors M3 and M4, to the gate-to-source voltage difference $V_{GS}$ of the transistors M3 and M4, so that the voltage at the node A (or node B) can be pulled high even faster.

Figure 11:
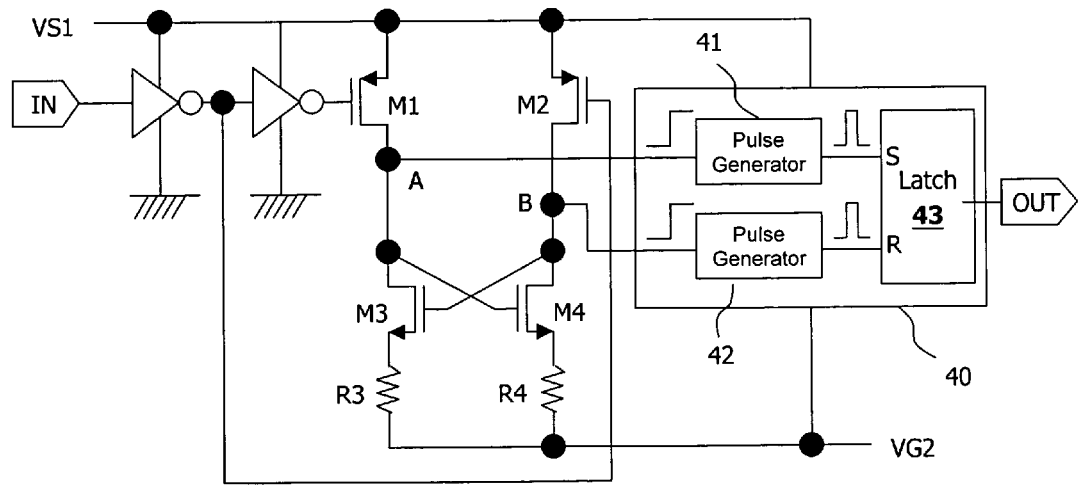
FIG. 11 shows another embodiment of the present invention.

The features, characteristics and effects of the present invention have been described with reference to certain embodiments, which are illustrative of the invention and not for limiting of the invention. Various other substitutions and modifications will occur to those skilled in the art, without departing from the spirit of the present invention. For example, in each of the described embodiments, the latch circuit may be replaced by another type of latch circuit, instead of the SR latch. In the embodiment of FIG. 9, the negative pulses driving the PMOS transistors M11 and M12 may be replaced by positive pulses driving the NMOS transistors. In the embodiments of FIG. 10-11, the voltage drop can be achieved by circuit devices other than resistors. Therefore, all such substitutions and modifications are intended to be embraced within the scope of the invention as defined in the appended claims.

What is claimed is:

1. A level shift circuit comprising:
a basic level shift circuit for receiving inputs of first high and low operational voltage levels and generating outputs of second low and high operational voltage levels at a first node; and
an output circuit for outputting a signal of one of the second operational voltage levels according to a voltage level switching at the first node, the output circuit including a first pulse generator which generates a first pulse according to the voltage level switching at the first node and a latch circuit which generates an output according to the generated first pulse,
wherein the basic level shift circuit includes a pair of PMOS transistors and a pair of NMOS transistors, in which the source of each of the PMOS transistors is electrically connected with a voltage supply of the second high operational voltage via a voltage-drop circuit, and the drain of each of the PMOS transistors is electrically connected with the gate of the other of the PMOS transistors; and in which the source of each of the NMOS transistors is grounded, and the drain of each of the NMOS transistors is electrically connected with the drain of one of the PMOS transistors, respectively; the gate of one of the NMOS transistors being electrically connected with an input of one of the first operational voltage levels.

2. The level shift circuit of claim 1, wherein the second high operational voltage level is higher than the first high operational voltage level.

3. The level shift circuit of claim 1, wherein the basic level shift circuit receives inputs of first high and low operational voltage levels and generating outputs of second high and low operational voltage levels at a second node, and the output circuit further includes a second pulse generator which generates a second pulse according to a voltage level switching at the second node, the second pulse causing the latch circuit to generate an output signal of the other one of the second operational voltage levels.

4. The level shift circuit of claim 1, wherein the first pulse generator generates the first pulse according to a falling edge of a voltage at the first node.

5. The level shift circuit of claim 1, wherein the first pulse generator generates the first pulse according to a rising edge of a voltage at the first node.

6. The level shift circuit of claim 1, wherein the voltage-drop circuit includes a resistor.

7. A level shift circuit comprising:
a basic level shift circuit for receiving inputs of first high and low operational voltage levels and generating outputs of second low and high operational voltage levels at a first node; and
an output circuit for outputting a signal of one of the second operational voltage levels according to a voltage level switching at the first node, the output circuit including a first pulse generator which generates a first pulse according to the voltage level switching at the first node, and a latch circuit which generates an output according to the generated first pulse,
wherein the basic level shift circuit includes a pair of PMOS transistors and a pair of NMOS transistors, in which the source of each of the PMOS transistors is electrically connected with a voltage supply of the first high operational voltage, and the drain of each of the PMOS transistors is electrically connected with the drain of each of the NMOS transistors, respectively; and in which the source of each of the NMOS transistors is electrically connected with a voltage supply of the second low operational voltage via a voltage-drop circuit, and the drain of each of the NMOS transistors is electrically connected with the gate of the other of NMOS transistor; the gate of one of the PMOS transistors being electrically connected with an input of one of the first operational voltage levels.

8. The level shift circuit of claim 7, wherein the voltage-drop circuit includes a resistor.

9. The level shift circuit of claim 7, wherein the second low operational voltage level is lower than the first low operational voltage level.

10. A method to achieve faster output level switching in a level shift circuit, comprising:
providing a basic level shift circuit for receiving inputs of first high and low operational voltage levels and generating outputs of second low and high operational voltage levels at a first node, wherein the basic level shift circuit includes a pair of PMOS transistors and a pair of NMOS transistors in which the source of each of the PMOS transistors is electrically connected with a voltage supply of the second high operational voltage, and the drain of each of the PMOS transistors is electrically connected with the gate of the other of the PMOS transistors; and in which the source of each of the NMOS transistors is grounded, and the drain of each of the NMOS transistors is electrically connected with the drain of one of the PMOS transistors, respectively; the gate of one of the NMOS transistors being electrically connected with an input of one of the first operational voltage levels;
generating a pulse according to a voltage level switching at the first node;
generating a signal of one of the second operational voltage levels according to the pulse; and
decreasing the gate to source voltage difference of: at least one of the PMOS transistors and NMOS transistors.

11. The method of claim 10, wherein the pulse is generated according to a falling edge of the voltage at the first node.

12. The method of claim 10, wherein the pulse is generated according to a rising edge of the voltage at the first node.

13. The method of claim 10, wherein the basic level shift circuit receives inputs of first high and low operational voltage levels and generating outputs of second high and low operational voltage levels at a second node, and the method further comprising: generating another pulse according to a voltage level switching at the second node; and generating a signal of the other one of the second operational voltage levels according to the another pulse.

* * * * *